(12) United States Patent
Weishaupt et al.

(10) Patent No.: US 12,498,541 B2
(45) Date of Patent: Dec. 16, 2025

(54) ASSEMBLY HAVING A DECOUPLING JOINT FOR MECHANICALLY MOUNTING AN ELEMENT

(71) Applicant: Carl Zeiss SMT GmbH, Oberkochen (DE)

(72) Inventors: Philipp Weishaupt, Augsburg (DE); David Borowski, Koesching (DE); Thomas Stuebler, Haunsfeld (DE); Roland Gischa, Bibertal (DE); Matthias Kestel, Dresden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 341 days.

(21) Appl. No.: 18/319,994

(22) Filed: May 18, 2023

(65) Prior Publication Data
US 2023/0288661 A1 Sep. 14, 2023

Related U.S. Application Data

(63) Continuation of application No. PCT/EP2021/082337, filed on Nov. 19, 2021.

(30) Foreign Application Priority Data

Jan. 11, 2021 (DE) .......................... 102021200131.9

(51) Int. Cl.
*G02B 7/18* (2021.01)
*G02B 7/182* (2021.01)

(52) U.S. Cl.
CPC ............ *G02B 7/181* (2013.01); *G02B 7/182* (2013.01)

(58) Field of Classification Search
CPC .................................. G02B 7/181; G02B 7/182
USPC ........................................................... 359/871
See application file for complete search history.

(56) References Cited

U.S. PATENT DOCUMENTS

| 5,428,482 A | * | 6/1995 | Bruning | G02B 7/021 359/811 |
| 6,229,657 B1 | | 5/2001 | Holderer et al. | |
| 6,239,924 B1 | * | 5/2001 | Watson | G02B 7/028 359/811 |
| 8,947,634 B2 | | 2/2015 | Farnsworth et al. | |

(Continued)

FOREIGN PATENT DOCUMENTS

| DE | 198 25 716 A1 | 12/1999 |
| DE | 10 2008 009 600 A1 | 8/2009 |

(Continued)

OTHER PUBLICATIONS

International Search Report and Written Opinion for corresponding PCT Appl No. PCT/EP2021/082337, dated Mar. 10, 2022.

(Continued)

*Primary Examiner* — Sharrief I Broome
(74) *Attorney, Agent, or Firm* — Fish & Richardson P.C.

(57) ABSTRACT

An assembly comprises an element that is mechanically stressed during operation or transport in at least one loading direction, and a decoupling joint for mechanically mounting the element. The decoupling joint effects at least partial decoupling in the loading direction. The decoupling joint is composed of a plurality of separate joint segments. At least two of these joint segments are shifted relative to one another in the loading direction in a stepped arrangement.

20 Claims, 9 Drawing Sheets

(56) References Cited

U.S. PATENT DOCUMENTS

| | | |
|---|---|---|
| 2008/0043349 A1 | 2/2008 | Rief et al. |
| 2008/0144199 A1 | 6/2008 | Schoeppach et al. |
| 2011/0109891 A1* | 5/2011 | Farnsworth ......... G03F 7/70825 |
| | | 219/69.11 |
| 2016/0246028 A1* | 8/2016 | Erbe ....................... G02B 7/008 |
| 2017/0153552 A1 | 6/2017 | Prochnau et al. |
| 2017/0176741 A1* | 6/2017 | Enkisch ................. G03F 7/7015 |
| 2017/0363833 A1 | 12/2017 | McMaster |
| 2019/0004275 A1 | 1/2019 | McMaster et al. |
| 2019/0086823 A1 | 3/2019 | Schaffer et al. |
| 2019/0384187 A1 | 12/2019 | Weber et al. |

FOREIGN PATENT DOCUMENTS

| | | | |
|---|---|---|---|
| DE | 10 2017 202 653 A1 | 8/2018 | |
| DE | 10 2020 203 713 A1 | 4/2021 | |
| EP | 1 081 521 A2 | 3/2001 | |
| EP | 1081521 B1 * | 4/2006 | ......... G03F 7/70825 |
| TW | 201614380 A | 4/2016 | |
| TW | 201809860 A | 3/2018 | |
| WO | WO 2007/017013 A2 | 2/2007 | |
| WO | WO 2009/100856 A1 | 8/2009 | |

OTHER PUBLICATIONS

International Preliminary Report on Patentability for corresponding PCT Appl No. PCT/EP2021/082337, dated Jul. 20, 2023.

German Office Action, with translation thereof, for corresponding DE Appl No. 10 2021 200 131.9, dated Aug. 18, 2021.

Office Action in European Appln. No. 21816409.3, mailed on Sep. 3, 2025, 4 pages.

Office Action in Taiwanese Appln. No. 111100952, mailed on Aug. 11, 2025, 12 pages (with English translation).

Search Report in Taiwanese Appln. No. 111100952, mailed on Jul. 10, 2025, 2 pages (with English translation).

* cited by examiner

ASSEMBLY HAVING A DECOUPLING JOINT FOR MECHANICALLY MOUNTING AN ELEMENT

CROSS-REFERENCE TO RELATED APPLICATIONS

The present application is a continuation of, and claims benefit under 35 USC 120 to, international application PCT/EP2021/082337, filed Nov. 19, 2021, which claims benefit under 35 USC 119 of German Application No. 10 2021 200 131.9, filed Jan. 11, 2021. The entire disclosure of these applications are incorporated by reference herein.

FIELD

The disclosure relates to an assembly having an element and a decoupling joint for mechanically mounting the element. The element can be an optical element, such as a mirror or a mirror array, for example in a microlithographic projection exposure apparatus. The element or assembly can furthermore also be an element or assembly for other applications, for example in metrology, precision mechanics or medical technology.

BACKGROUND

Microlithography is used for producing microstructured component parts, such as integrated circuits or LCDs. The microlithography process is performed in what is known as a projection exposure apparatus, which has an illumination device and a projection lens. The image of a mask (=reticle) that is illuminated via the illumination device is here projected onto a substrate (e.g. a silicon wafer), which is coated with a light-sensitive layer (photoresist) and is arranged in the image plane of the projection lens, via the projection lens in order to transfer the mask structure onto the light-sensitive coating of the substrate.

In a projection exposure apparatus designed for EUV (e.g. for wavelengths of e.g. approximately 13.5 nm or below), mirrors are used as optical components for the imaging process due to a general absence of light-transmissive materials. In the illumination device of a microlithographic projection exposure apparatus designed for operation in the EUV range, the use of facet mirrors in the form of field facet mirrors and pupil facet mirrors as beam-guiding components is known e.g. from DE 10 2008 009 600 A1. Such facet mirrors are generally composed of a multiplicity of individual mirrors or mirror facets, which can be designed to be tiltable via flexures and actuators in each case for the purpose of adjustment or for realizing specific illumination angle distributions.

Typically, the EUV mirrors are, among other things, heated as a result of absorption of the radiation emitted by the EUV light source and, associated therewith, undergo thermal expansion or deformation, which can in turn lead to an impairment of the imaging properties of the optical system.

Various approaches are known for addressing surface deformations caused by the input of heat into an EUV mirror and associated optical aberrations. These include for example active direct cooling or immediate electric heating. Directly cooling a mirror or mirror array in a specific case of application may not be possible or desirable. The thermal expansion of the mirror or mirror array that is associated with the radiation-related heating can lead to constraint forces or mechanical tensions, which may result for example from different thermal expansions of the mirror or mirror array and also from the—typically cooled—mechanical surround.

For addressing stress-related deformations, the use of decoupling joints is known, which are intended to "absorb" thermally induced expansions of the respective optical element in the case of the mechanical connection of the respective mirror or mirror array and to avoid mechanical tensions in this way. Depending on the specific application scenario, however, the degrees of freedom that are "decoupled" by such a decoupling joint can prove to be insufficient for ensuring free thermal expansion without the introduction of constraint forces or mechanical tensions.

The deformation of a decoupling joint, which occurs in the decoupling joint and accompanies the thermal expansion of the optical element or mirror, can lead to high mechanical stresses in the decoupling joint that may exceed critical values. In addition, a stress-optimized configuration of the decoupling joint may additionally be made more difficult by the installation space available in the respective optical system generally being very limited. As a result, the suitable configuration and arrangement of the decoupling joints in relation to the optical element or mirror or mirror array can prove to be a considerable challenge in practice. If deformations and/or displacements of the optically effective surface occur owing to remaining constraint forces, they can lead to an impairment of the optical properties or of the performance capability of the respective optical system (e.g. the projection exposure apparatus).

SUMMARY

The present disclosure seeks to provide an assembly that makes a reduction in undesirable stress-related deformations possible while avoiding certain undesired issues.

In an aspect, the disclosure provides an assembly comprising:
- an element that is mechanically stressed during operation or transport in at least one loading direction; and
- a decoupling joint for mechanically mounting the element, wherein the decoupling joint effects at least partial decoupling in the loading direction;
- wherein this decoupling joint is composed of a plurality of separate joint segments; and
- wherein at least two of the joint segments are shifted relative to one another in the loading direction in a stepped arrangement.

In embodiments of the disclosure, the element can be an optical element having an optical used region.

According to embodiments, the geometric arrangement of the joint segments is adapted to an outer contour of the optical used region.

According to embodiments, the loading direction runs radially with respect to a center point of the optical used region. Optionally, the alignment of the decoupling joint can furthermore be effected perpendicularly to the loading direction, as will be explained below.

The disclosure involves the concept of assembling a decoupling joint serving for mechanically mounting an optical element that is mechanically stressed in at least one loading direction during operation of a (for example optical) system from a plurality of separate joint segments, wherein in addition at least two of the joint segments are shifted relative to one another in the loading direction. Owing to the segmenting of the decoupling joint, as per the disclosure, and the associated possible adaptation of the individual joint segments to the mechanical loading present in the respective region, it is possible to implement a stress-optimized joint arrangement, wherein the adaptation of the individual joint segments both in terms of the alignment of these joint segments and in terms of the respective joint cross sections can take place in the sense of an adaptation of the joint geometry.

In addition, owing to the at least partial shift of the joint segments relative to one another taking place in the loading direction, this stress-optimized configuration can be combined with a space-saving geometric arrangement. For example, the segmenting of the decoupling joint can be selected, depending on the specific use scenario, such that the geometric arrangement of the joint segments is adapted to the outer contour of the (for example optical) used region, with the result that the discretization of the decoupling joint, as per the disclosure, can ultimately result in it lying closely against the respective contour of the used region.

As is described in more detail below with reference to different embodiments, it is possible here for example to "absorb" thermal expansion of the element owing to the decoupling joint according to the disclosure. As a result it is thus possible, even in the case of the element being retained within a (for example cooled) surround or retainer, for a free thermal expansion (that is to say thermal expansion that is not impaired by the retainer) of the element to be ensured and for the occurrence of undesirable constraint forces or mechanical stresses to be avoided while avoiding the problems described in the introductory part.

However, regarding the type of the mechanical stress of the element, the disclosure is not limited to thermally induced stresses or expansions. A merely exemplary further application of the disclosure can thus also relate to impact loads of the respective element (for example occurring during the transport of the element or of a system having the element).

Furthermore, the loading direction of the mechanical stress of the element may differ depending on the use scenario. For example, the loading direction can run radially with respect to a center point of the optical used region (as is typically the case with thermally induced expansion of the element). In other use scenarios, the loading direction (as is typically the case for impact or shock loads of an element during transport) can run in a constant linear spatial direction.

Depending on the concrete use scenario, the alignment of the joint segments themselves with respect to the loading direction can be perpendicular or else be at an angle that deviates from 90°, wherein the angle can have for example in each case a value in the range from 85° to 95°.

According to embodiments, at least two of the joint segments differ from one another in terms of their joint rigidity provided in one and the same decoupled degree of freedom. Of the at least two joint segments, optionally the joint segment that is exposed to a relatively greater mechanical stress has a lower joint rigidity than the other joint segment.

According to embodiments, the element is a lens element.

According to further embodiments, the element is a mirror.

According to further embodiments, the element is a mirror array. For example, the mirror array can be configured as a facet mirror having a plurality of mirror facets.

According to embodiments, the optical element is designed for an operating wavelength of less than 250 nm, such as less than 200 nm.

According to embodiments, the optical element is designed for an operating wavelength of less than 30 nm, such as less than 15 nm.

The disclosure furthermore also relates to an optical system of a microlithographic projection exposure apparatus having at least one assembly with the above-described features.

Further configurations of the disclosure can be found in the description and the claims.

BRIEF DESCRIPTION OF THE DRAWINGS

The disclosure will be explained in more detail below on the basis of exemplary embodiments illustrated in the appended figures, in which.

DETAILED DESCRIPTION OF PREFERRED EMBODIMENTS

Figure 9:
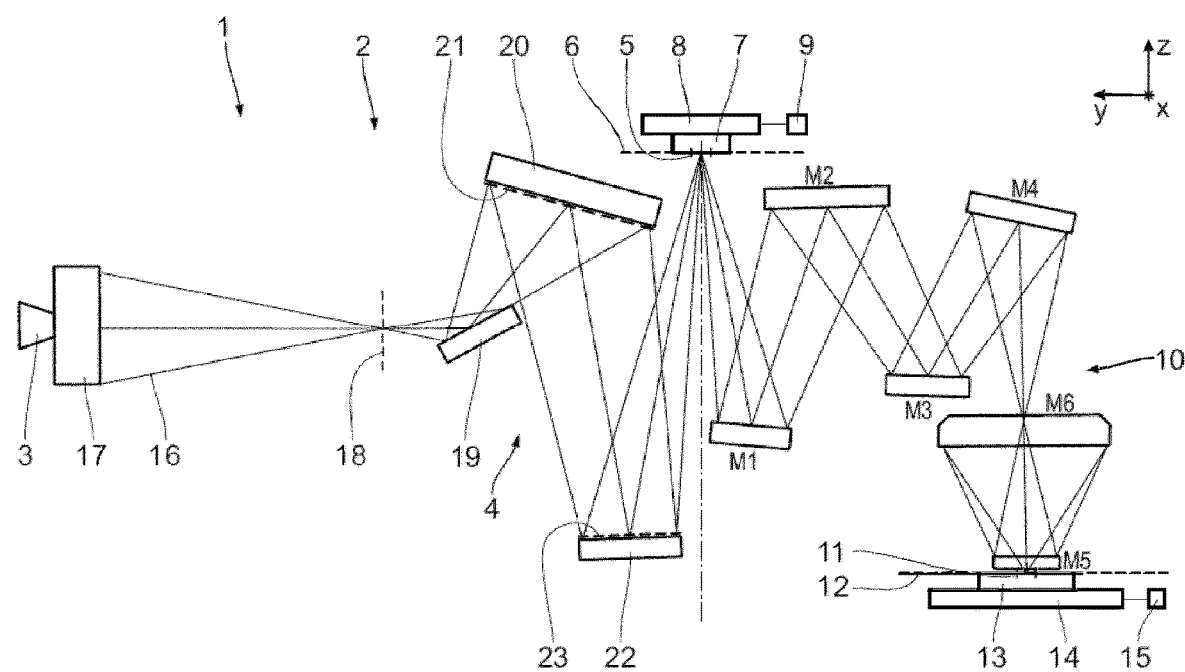
FIG. 9 shows a schematic illustration for explaining the possible setup of a microlithographic projection exposure apparatus designed for operation in the EUV range.

FIG. 9 schematically shows a meridional section of the possible setup of a microlithographic projection exposure apparatus designed for operation in the EUV range.

According to FIG. 9, the projection exposure apparatus 1 has an illumination device 2 and a projection lens 10. The illumination device 2 is used to illuminate an object field 5 in an object plane 6 with radiation from a radiation source 3 via an illumination optical unit 4. Hereby, a reticle 7 arranged in the object field 5 is exposed. The reticle 7 is held by a reticle holder 8. The reticle holder 8 is displaceable for example in a scanning direction via a reticle displacement drive 9. A Cartesian xyz-coordinate system is drawn in FIG. 9 for explanation purposes. The x-direction runs perpendicular to and into the drawing plane. The y-direction runs horizontally, and the z-direction runs vertically. The scanning direction in FIG. 9 runs along the y-direction. The z-direction runs perpendicular to the object plane 6.

The projection lens 10 serves for imaging the object field 5 into an image field 11 in an image plane 12. A structure on the reticle 7 is imaged onto a light-sensitive layer of a wafer 13 that is arranged in the region of the image field 11 in the image plane 12. The wafer 13 is held by a wafer holder 14. The wafer holder 14 is displaceable for example along the y-direction via a wafer displacement drive 15. The displacement of the reticle 7 via the reticle displacement drive 9 and the displacement of the wafer 13 via the wafer displacement drive 15 can be synchronized with one another.

The radiation source 3 is an EUV radiation source. The radiation source 3 for example emits EUV radiation, which will also be referred to as used radiation or illumination radiation below. The used radiation has for example a wavelength ranging between 5 nm and 30 nm. The radiation source 3 can be, for example, a plasma source, a synchrotron-based radiation source or a free-electron laser (FEL). The illumination radiation 16 emanating from the radiation source 3 is focused by a collector 17 and propagates through an intermediate focus in an intermediate focal plane 18 into the illumination optical unit 4. The illumination optical unit 4 has a deflection mirror 19 and, arranged downstream thereof in the beam path, a first facet mirror 20 (with schematically indicated facets 21) and a second facet mirror 22 (with schematically indicated facets 23).

The projection lens 10 has a plurality of mirrors Mi (i=1, 2, . . . ), which are numbered in accordance with their arrangement in the beam path of the projection exposure apparatus 1. In the example illustrated in FIG. 9, the projection lens 10 has six mirrors M1 to M6. Alternatives with four, eight, ten, twelve or a different number of mirrors Mi are likewise possible. The penultimate mirror M5 and the last mirror M6 each have a through opening for the illumination radiation 16. The projection lens 10 is a double-obscured optical unit. The projection lens 10 has an image-side numerical aperture that is greater than 0.5 and that can also be greater than 0.6 and that can be, for example, 0.7 or 0.75.

During operation of the microlithographic projection exposure apparatus 1, the electromagnetic radiation that is incident on the optically effective surface of the mirrors is in part absorbed and, as was explained in the introductory part, can lead to heating and, associated therewith, thermal expansion or deformation, which in turn can result in an impairment of the imaging properties of the optical system. The concept according to the disclosure for mounting an optical element can thus be applied to any mirror of the microlithographic projection exposure apparatus 1 of FIG. 9.

The disclosure is not limited to the application in a projection exposure apparatus that is designed for operation in the EUV range. For example, the disclosure can also be applied in a projection exposure apparatus that is designed for operation in the DUV range (that is to say at wavelengths of less than 250 nm, for example less than 200 nm), or else in a different optical system.

Initially, aspects of the present disclosure will be explained below with reference to a comparison between the schematic illustrations of FIG. 1 and FIG. 8.

Figure 8:
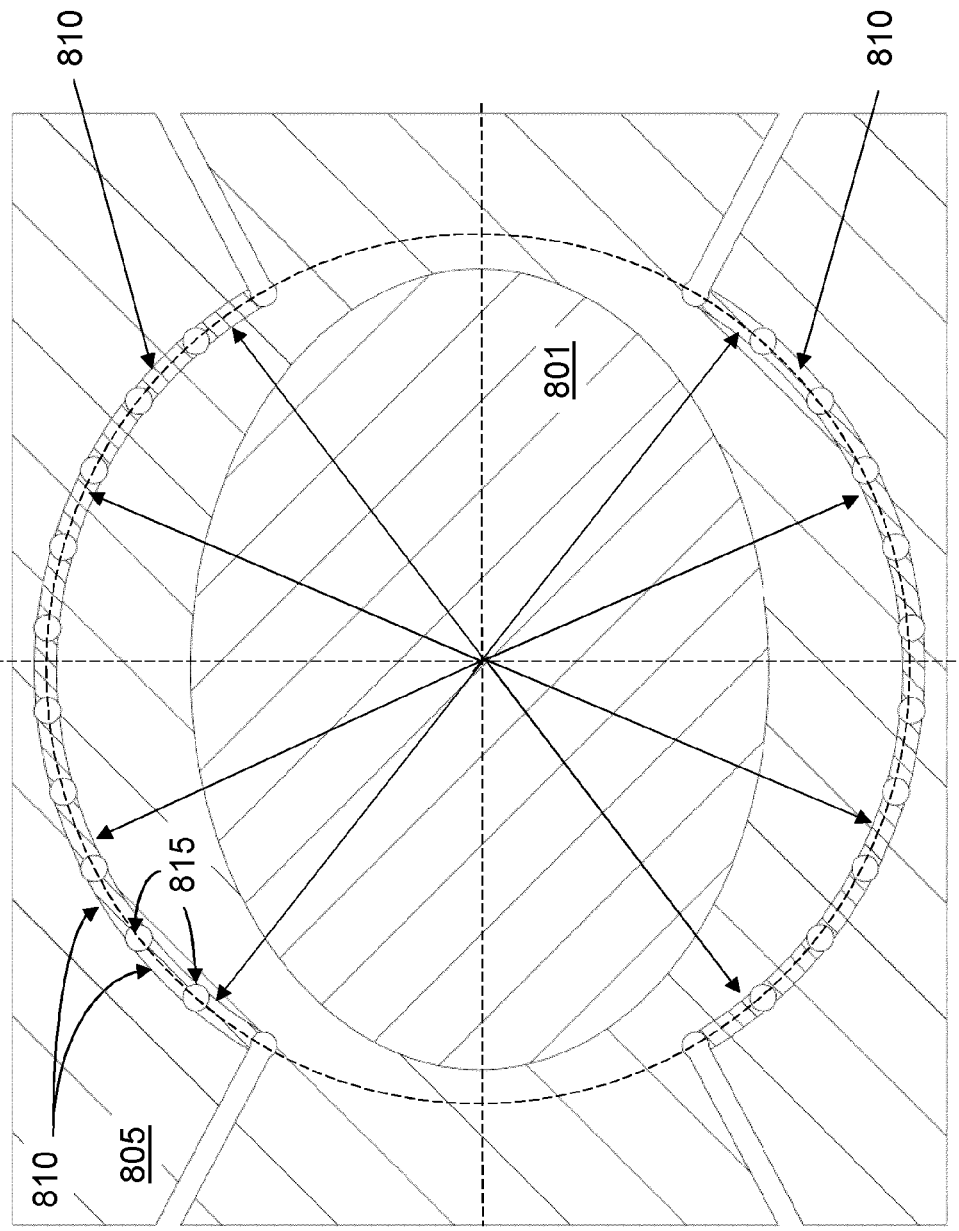
FIG. 8 shows a schematic illustration for explaining setup and functioning of a conventional assembly.

Initially with reference to FIG. 8, a plan view of an optical element surrounded by an outer retainer 805 is schematically illustrated, wherein an optically effective surface corresponding to the optical used region of the element is denoted by 801. The optically effective surface 801 has an elliptical geometry in the example shown (but without the disclosure being limited thereto). Impingement of the optically effective surface 801 with electromagnetic radiation, which occurs during the operation of the optical element or of the optical system having the element, can cause, as was already described in the introductory part, thermal expansion of the optical used region, wherein a decoupling joint is provided that is composed of a plurality of joint segments 810 and surrounds the optical used region or the optically effective surface 801 to avoid thermally induced mechanical stresses and, associated therewith, optical aberrations. Cut-out regions between adjacent joint segments 810 of the decoupling joint are denoted by 815.

As is illustrated by arrows depicted in FIG. 8, the loading direction of the previously described thermal loading of the optical element runs in the radial direction with respect to a center point of the optically effective surface 801. Furthermore, as is evident from FIG. 8, the individual joint segments 810 of the decoupling joint are each arranged substantially perpendicularly to the loading direction, as a result of which undesirable bending stress of the joint segments can be avoided. As is likewise illustrated in FIG. 8, this arrangement of the joint segments perpendicular to the loading direction results in a circular overall arrangement of the joint segments, with the consequence that a significant desire for installation space arises.

Figure 1:
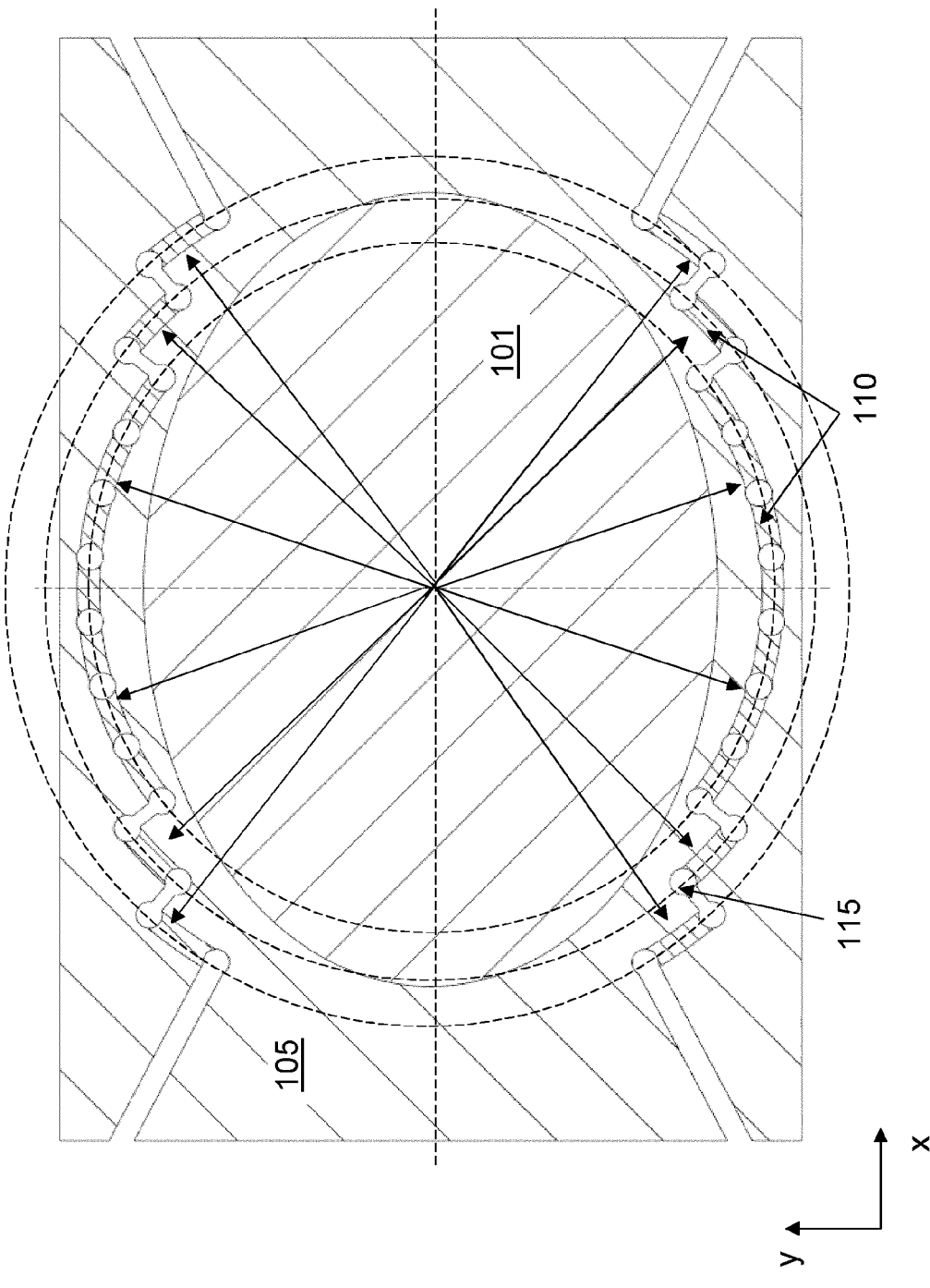
FIG. 1 shows a schematic illustration for explaining setup and functioning of an assembly according to the disclosure in a first embodiment.

FIG. 1 now shows a schematic illustration of an exemplary embodiment of an assembly according to the disclosure that is analogous to FIG. 8. The assembly according to FIG. 1 initially has, in a manner that is analogous to FIG. 8, an optical element with an optically effective surface 101, which is again elliptical in the exemplary embodiment and which is surrounded by a retainer 105, wherein a decoupling joint composed of a plurality of joint segments 110 is provided for avoiding mechanical tension associated with thermal expansion of the optical used region or of the optically effective surface 101. To avoid undesirable bending stress of the decoupling joint or of the joint segments 110, the joint segments 110 are in turn arranged substantially perpendicular to the loading direction of the thermal loading running radially with respect to the center point of the optically effective surface 101.

As opposed to the setup of FIG. 8, however, with respect to some of the joint segments in the setup according to FIG. 1, a relative shift with respect to one another in the loading direction is effected with the consequence that no longer all of the joint segments 110 are arranged along one and the same circumference, but rather some of the joint segments 110 are arranged (according to the concentrically arranged circles drawn in dashes in FIG. 1) closer to the center point of the optically effective surface 101 than other ones of the joint segments 110.

As is evident from FIG. 1, in this way the installation space taken up by the assembly overall is significantly reduced as compared to the arrangement of FIG. 8, wherein at the same time the stress-optimized arrangement (which, in the specific example, is perpendicular to the loading direction) of the joint segments 110 is maintained.

The above-described relative shift of joint segments 110 in the loading direction can also be effected, in the sense of a stronger discretization (that is to say an even finer segmentation) of the decoupling joint, for an even larger number of joint segments, whereby ultimately an even better adaptation to the outer contour of the optical used region or the optically effective surface 101 of the optical element can be attained.

Figure 4A:
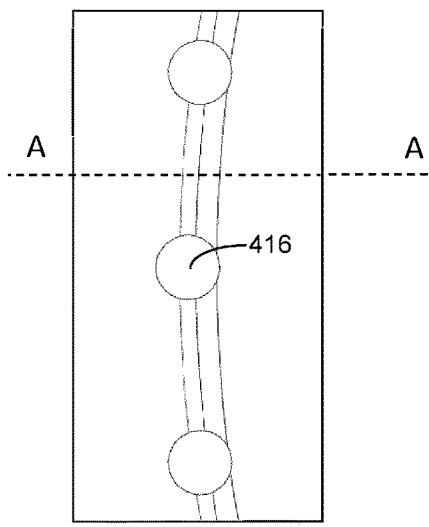
FIGS. 4A-4C show schematic illustrations for explaining the possible setup of a joint segment present in an assembly according to the disclosure.
Figure 4B:
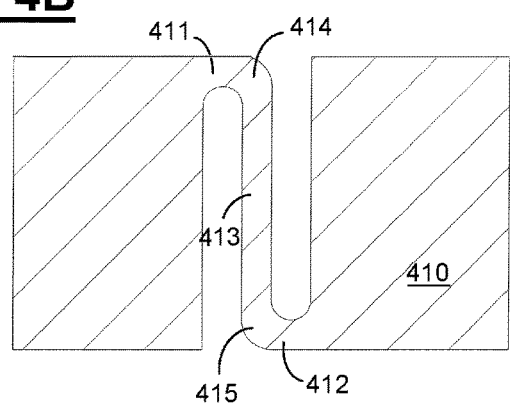
Figure 4C:
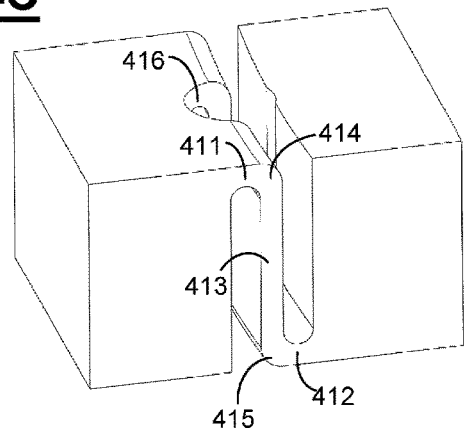
Figure 7:
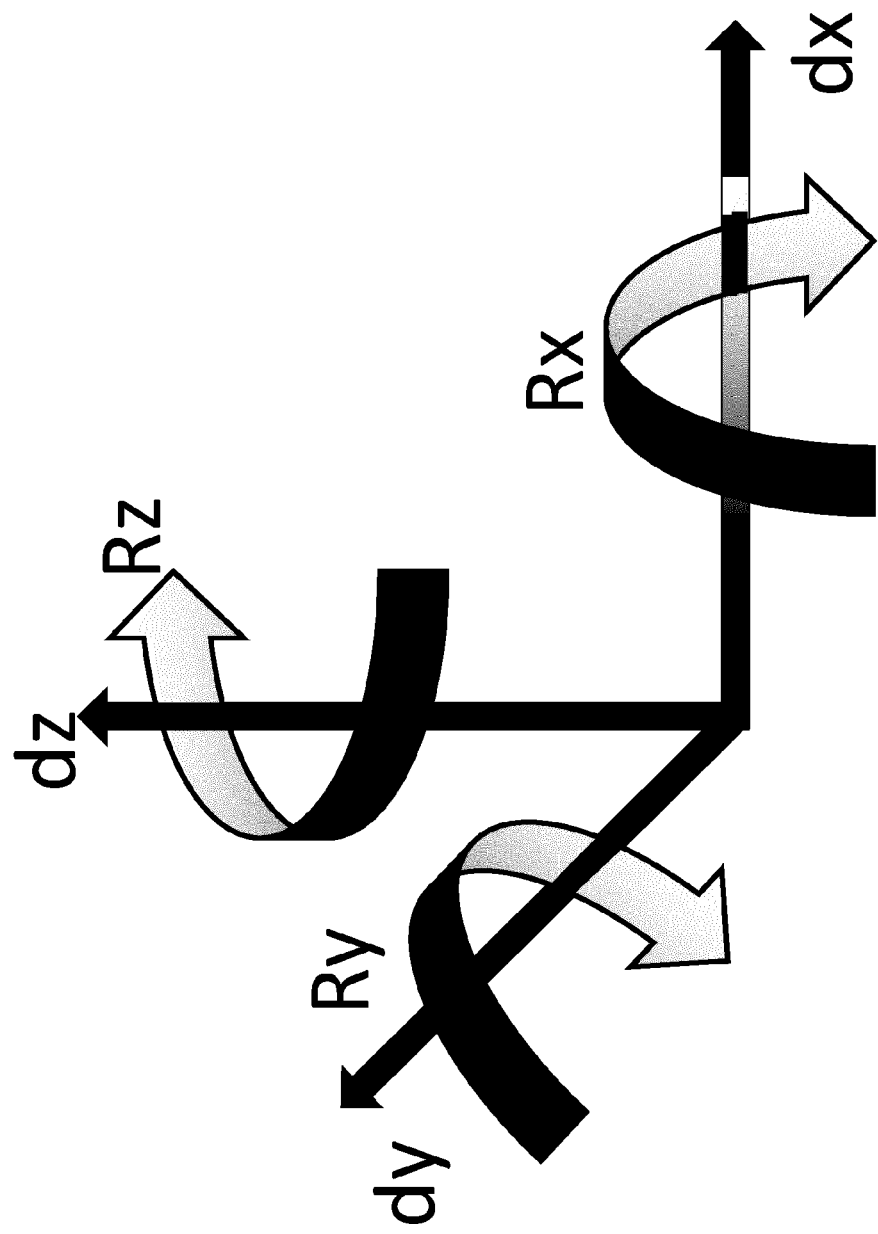
FIG. 7 shows a diagram for explaining terminology used in the context of the present application.

One possible configuration of a decoupling joint according to the disclosure or of the associated joint segments is shown in a first embodiment in FIG. 4B in section and in FIG. 4C in a perspective view, wherein successive joint sections are denoted with 411, 413, 412 and rotary bearings that are in each case located between them are denoted with 414, 415. According to the schematic illustration in FIG. 4A, a plurality of such decoupling joints can be arranged in the circumferential direction adjacent to one another and separated from one another by cutouts 416 for circumferentially surrounding an optical element, wherein FIG. 4B shows a sectional view along the line A-A from FIG. 4A. With respect to the terminology used for designating the individual degrees of freedom, reference is made to the diagram in FIG. 7.

Figure 5:
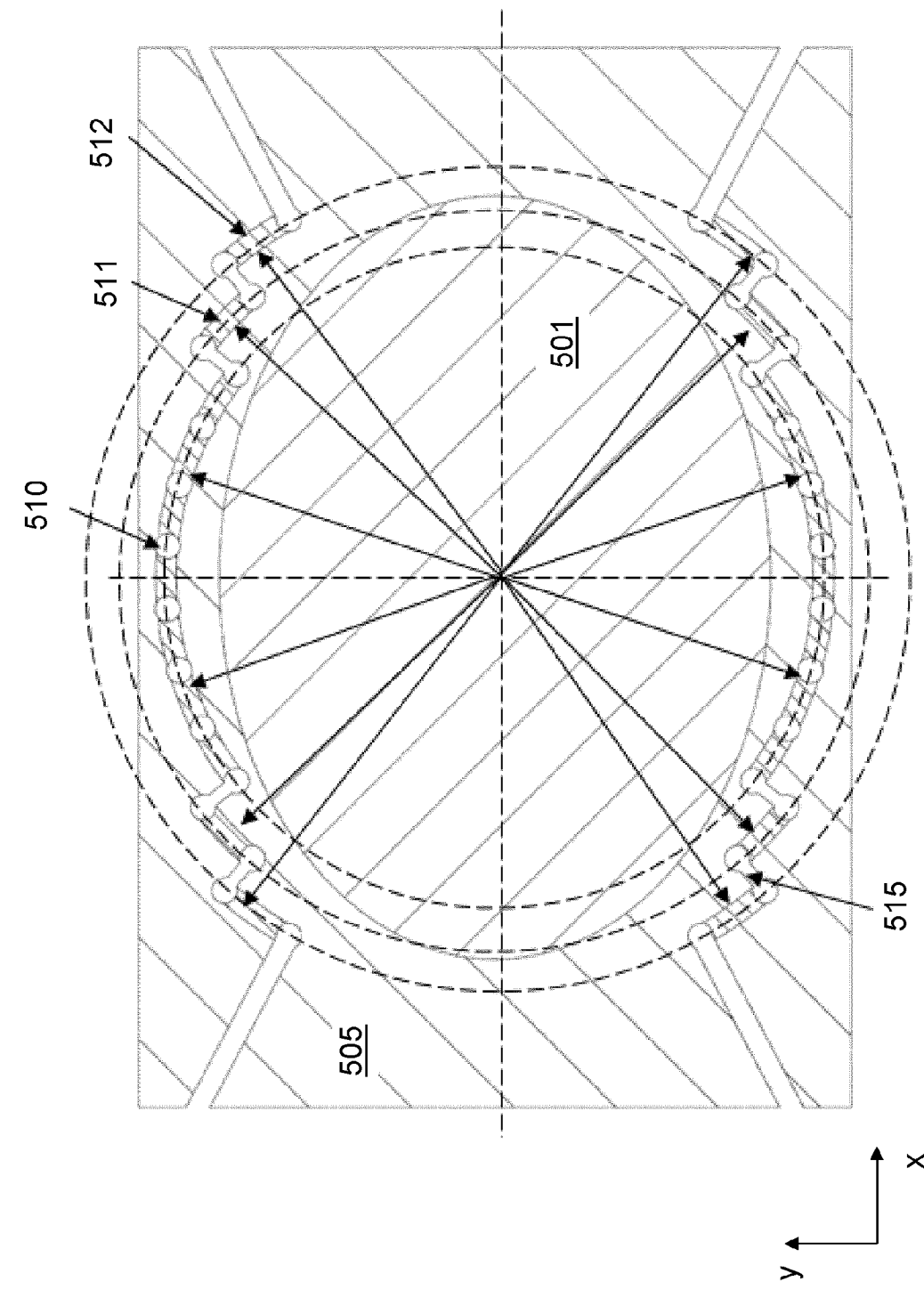
FIG. 5 shows a schematic illustration for explaining setup and functioning of an assembly according to the disclosure in a further embodiment.

In addition to the savings achieved in terms of installation space or volume, the shift of the joint segments in the loading direction according to the disclosure can also cause a reduction in the mechanical stress occurring in the loading direction for the joint segments 110 that have been shifted radially inwardly compared to the arrangement of FIG. 8. For example, an adaptation of the joint geometry or joint cross sections for sectionally optimizing the decoupling joint with respect to mechanical stress and rigidity can also take place in the individual joint segments. FIG. 5 shows an embodiment that is an example thereof based on the arrangement from FIG. 1.

Figure 6A:
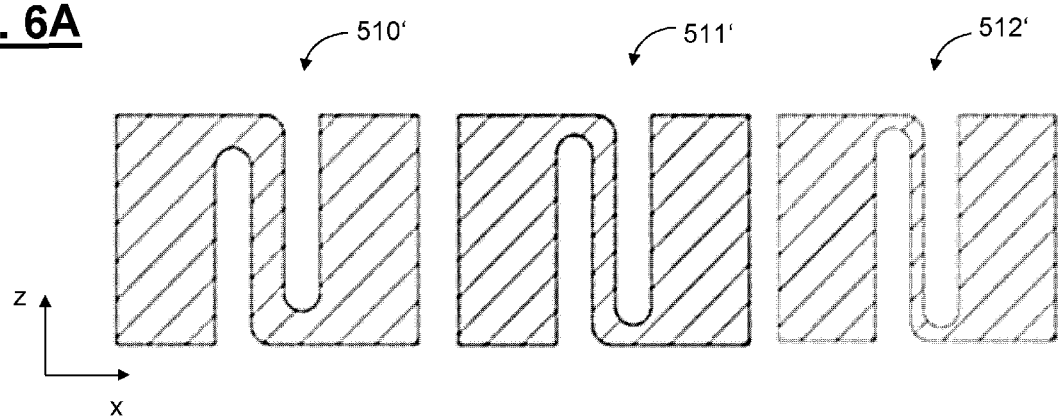
FIGS. 6A-6B show schematic illustrations for explaining the possible setup of further joint segments that may be used in an assembly according to the disclosure.
Figure 6B:
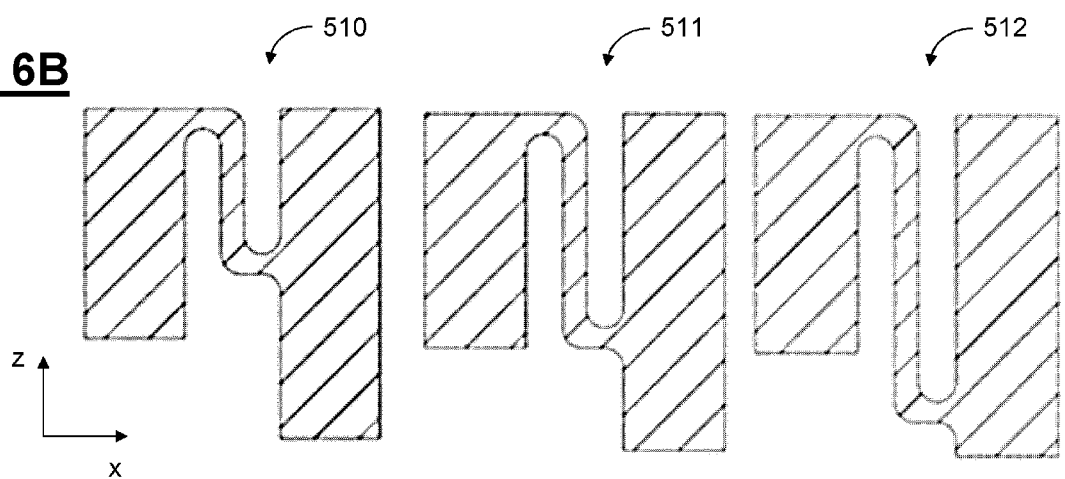

The decoupling joint illustrated in FIG. 5, in a plan view analogously to FIG. 1, has joint segments 510, 511 and 512, for which possible exemplary embodiments are illustrated in sectional views in FIG. 6A-6B. The greater the distance of the joint segments 510, 511 and 512 from the starting point of the thermal expansion (evident in the illustration of FIG. 5 as the radius of the associated circle) is, the greater are the mechanical stresses that occur for an unchanging joint cross section. To reduce these stresses, the joint cross section should be designed to be less rigid. A lower joint rigidity can be achieved, merely by way of example, as shown in FIG. 6A, by reducing the second moment of area (lower height and width of the cross section) or, as shown in FIG. 6B, by way of a greater bending length. Furthermore, a variation of the joint rigidity can also be achieved by changing the fillets between successive joint sections. However, reducing the joint rigidity can also lead to significantly lower natural frequencies of the system. If the rigidity of the joints is reduced to the same extent in all the joint segments 510, 511 and 512, it is possible that specifications with respect to critical values of the natural frequencies are no longer adhered to. In a sectional optimization, it is possible according to FIG. 6A or FIG. 6B to design the joint segment 512 or 512' with the highest mechanical stresses with a relatively soft joint cross section and to provide the joint segments 510 and 511 or 510' and 511' with lower mechanical loading with more rigid joint geometries.

Figure 2:
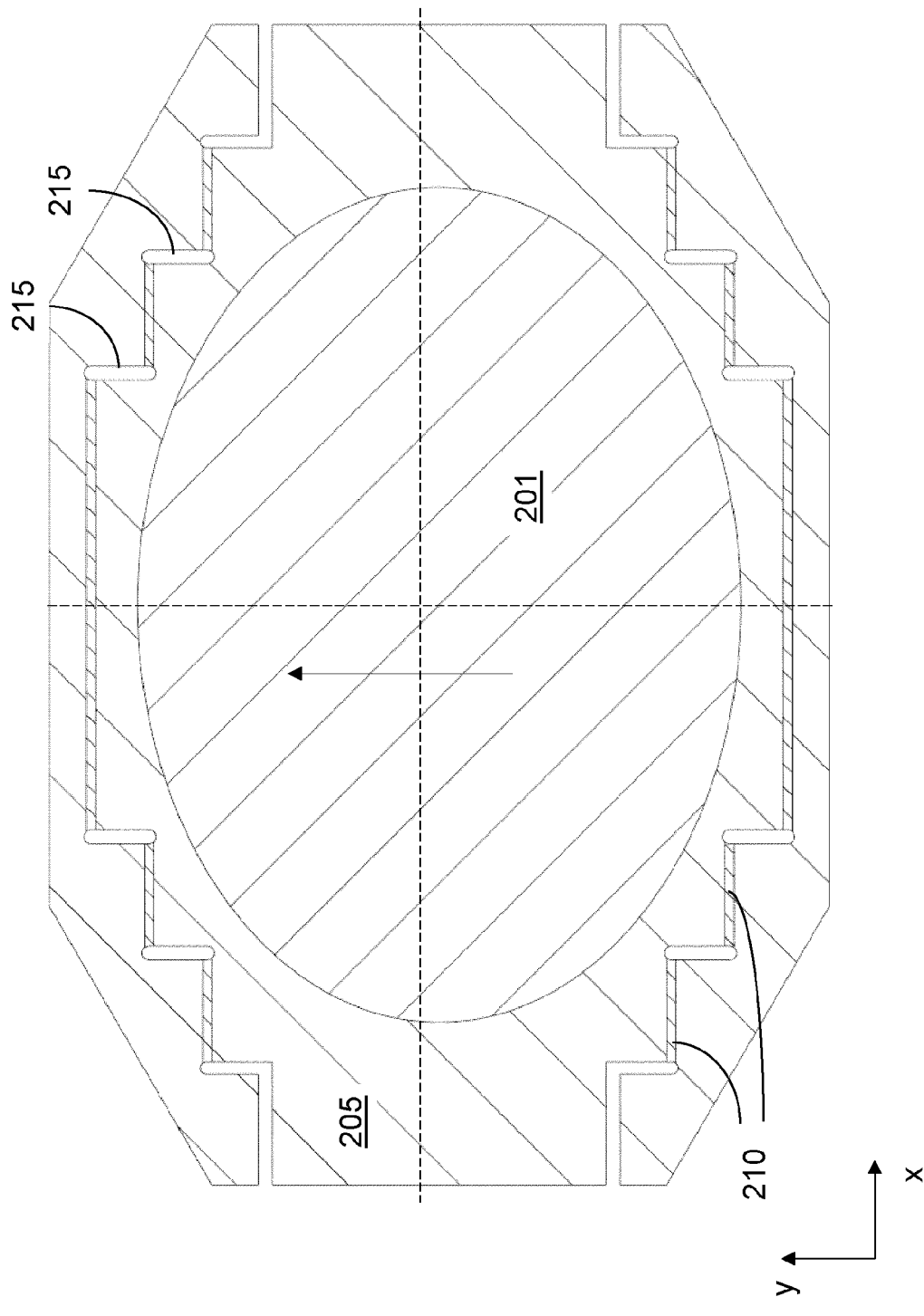
FIG. 2 shows a schematic illustration for explaining setup and functioning of an assembly according to the disclosure in a further embodiment.

FIG. 2 shows a schematic illustration for explaining the possible setup of an assembly according to the disclosure in a further embodiment, wherein, compared to FIG. 1, analogous or substantially identically functioning components are denoted with reference signs increased by 100.

In the scenario based on the embodiment of FIG. 2, it is assumed that the loading direction of a mechanical stress of an optical element having the optically effective surface 201 does not run in the radial direction, as in FIG. 1, but in a constantly linear direction (in the example along the y-direction in the coordinate system shown in FIG. 2). Merely by way of example, the relevant mechanical loading may be an impact or shock load occurring during transport of the optical element or of the optical system having the element.

As is evident from FIG. 2, a relative shift of some of the joint segments 210 of the decoupling joint relative to one another in the loading direction occurs in this embodiment, too. Furthermore, the joint segments themselves in the embodiment of FIG. 2 are also arranged, analogously to FIG. 1, perpendicular to the loading direction, that is to say along the y-direction in the depicted coordinate system. Overall, a significant saving in terms of installation space can thus also be attained in this embodiment with a stress-optimized arrangement of the joint segments 210. Furthermore, increasing adaptation of the geometric arrangement to the outer contour of the optically effective surface 201 or the optical used region can also be attained in the embodiment of FIG. 2, analogously to FIG. 1, by further increasing the segmentation or discretization of the decoupling joint.

Figure 3:
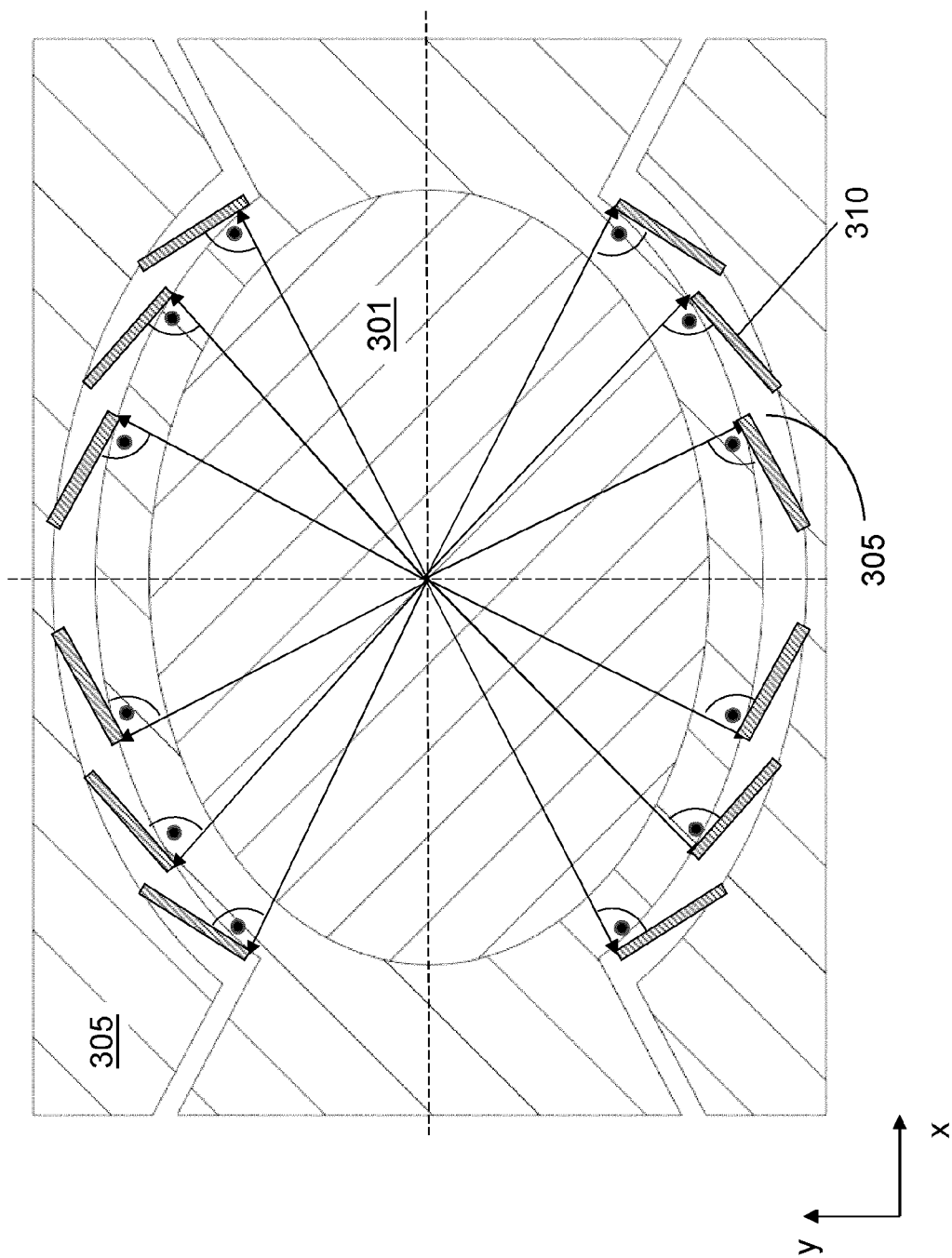
FIG. 3 shows a schematic illustration for explaining setup and functioning of an assembly according to the disclosure in a further embodiment.

FIG. 3 shows a further schematic illustration, which is analogous to FIG. 1 and FIG. 2, wherein again, compared to FIG. 1, analogous or substantially identically functioning components are denoted with reference signs increased by 200. The assembly according to FIG. 3 differs from that according to FIG. 1 for example in that the joint segments 310 are designed as bending beams with a substantially rectangular cross section to attain a pliable configuration of the decoupling joint.

The individual joint segments 310 are mounted perpendicular to the radial direction of the thermal expansion. Analogously to the sectional optimization of the joints shown in FIG. 5, the bending beams in FIG. 3 can also be modified by adapting the second moment of area (height and width of the cross section) and the bending length with respect to the rigidity.

Even though the disclosure was described using specific embodiments, a person skilled in the art will be able to see numerous variations and alternative embodiments, for example by combining and/or exchanging features of individual embodiments. Accordingly, it is obvious for a person skilled in the art that such variations and alternative embodiments are also encompassed by the present disclosure, and that the scope of the disclosure is limited only within the meaning of the attached patent claims and their equivalents.

What is claimed is:

1. An assembly, comprising:
an element that is configured to be mechanically stressed in a loading direction during operation or transport; and
a decoupling joint mechanically mounting the element, wherein:
the decoupling joint effects at least partial decoupling in the loading direction;
the decoupling joint comprises a first plurality of separate joint segments and a second plurality of separate joint segments;
each joint segment of the first plurality of separate joint segments is a first distance from a center of the element along a radial direction from the center of the element;
each joint segment of the second plurality of separate joint separate segments is a second distance from the center of the element in the radial direction from the center of the element; and
the first distance is different from the second distance.

2. The assembly of claim 1, wherein the element comprises an optical element, and the optical element comprises an optical used region.

3. The assembly of claim 2, a geometric arrangement of the first and second pluralities of separate joint segments is adapted to an outer contour of the optical used region.

4. The assembly of claim 3, wherein the loading direction runs radially with respect to a center point of the optical used region.

5. The assembly of claim 2, wherein the loading direction runs radially with respect to a center point of the optical used region.

6. The assembly of claim 1, wherein:
for each joint segment of the first joint plurality of separate joint segments, the joint segment is disposed on a first circle centered on the center of the element;

for each joint segment of the second joint plurality of separate joint segments, the joint segment is disposed on a second circle centered on the center of the element; and a radius of the first circle is different from a radius of the second circle.

7. The assembly of claim 1, wherein for each joint segment of the first and second pluralities of separate joint segments, the joint segment is:

arranged at an angle with respect to the loading direction; and the angle is from 85° to 95°.

8. The assembly of claim 1, wherein, in one and the same decoupled degree of freedom:

each joint segment of the first plurality of separate joint segments has a first rigidity;

each joint segment of the second plurality of separate joint segments has a second rigidity; and the first rigidity is different from the second rigidity.

9. The assembly of claim 1, wherein the assembly is configured so that:

each joint segment of the first plurality of separate joint segments is exposed to a first mechanical stress;

each joint segment of the second plurality of separate joint segments is exposed to a second mechanical stress;

the first mechanical stress is greater than the second mechanical stress;

each joint segment of the first plurality of separate joint segments has a first rigidity;

each joint segment of the second plurality of separate joint segments has a second rigidity; and the first rigidity is less than the second rigidity.

10. The assembly of claim 1, wherein the mechanical stress comprises a thermally induced expansion of the element during operation.

11. The assembly of claim 1, wherein the mechanical stress comprises an impact load of the element during transport.

12. The assembly of claim 1, wherein the element comprises a lens element.

13. The assembly of claim 1, wherein the element comprises a mirror.

14. The assembly of claim 1, wherein the element comprises a mirror array.

15. The assembly of claim 1, wherein the element comprises a facet mirror, and the facet mirror comprises a plurality of mirror facets.

16. The assembly of claim 1, wherein the optical element is configured for an operating wavelength of less than 250 nm.

17. The assembly of claim 1, wherein the optical element is configured for an operating wavelength of less than 200 nm.

18. The assembly of claim 1, wherein the optical element is configured for an operating wavelength of less than 30 nm.

19. The assembly of claim 1, wherein the optical element is configured for an operating wavelength of less than 15 nm.

20. An apparatus, comprising:

an optical system which comprises an assembly according to claim 1, wherein the apparatus is a microlithographic projection exposure apparatus.

* * * * *